United States Patent
Tan et al.

(10) Patent No.: US 8,149,527 B2
(45) Date of Patent: Apr. 3, 2012

(54) SYSTEMS AND METHODS FOR REDUCING ATTENUATION OF INFORMATION DERIVED FROM A DEFECTIVE MEDIUM

(75) Inventors: Weijun Tan, Longmont, CO (US); Hao Zhong, San Jose, CA (US); Yuan Xing Lee, San Jose, CA (US); Richard Rauschmayer, Longmont, CO (US); Shaohua Yang, Santa Clara, CA (US); Harley Burger, San Jose, CA (US); Kelly Fitzpatrick, Sudbury, MA (US); Changyou Xu, Fremont, CA (US)

(73) Assignee: AGERE Systems Inc., Allentown, PA (US)

( * ) Notice: Subject to any disclaimer, the term of this patent is extended or adjusted under 35 U.S.C. 154(b) by 1002 days.

(21) Appl. No.: 12/111,889

(22) Filed: Apr. 29, 2008

(65) Prior Publication Data

US 2009/0268575 A1 Oct. 29, 2009

(51) Int. Cl.
*G11B 5/02* (2006.01)
*G11B 27/36* (2006.01)
*G11B 5/09* (2006.01)

(52) U.S. Cl. .............................. 360/25; 360/31; 360/46
(58) Field of Classification Search .................. None
See application file for complete search history.

(56) References Cited

U.S. PATENT DOCUMENTS

| | | | |
|---|---|---|---|
| 6,065,149 A | 5/2000 | Yamanaka | |
| 6,691,263 B2 | 2/2004 | Vasic et al. | |
| 6,738,948 B2 | 5/2004 | Dinc et al. | |
| 6,980,382 B2 | 12/2005 | Hirano et al. | |
| 7,154,936 B2 | 12/2006 | Bjerke et al. | |
| 7,168,030 B2 | 1/2007 | Aryoshi | |
| 7,203,015 B2 | 4/2007 | Sakai et al. | |
| 7,237,173 B2 * | 6/2007 | Morita et al. ................. 714/755 |
| 7,254,192 B2 | 8/2007 | Onggosanusi | |
| 7,257,172 B2 | 8/2007 | Okamoto et al. | |
| 7,359,313 B2 | 4/2008 | Chan et al. | |
| 7,441,174 B2 | 10/2008 | Li et al. | |
| 7,688,915 B2 | 3/2010 | Tanrikulu | |
| 2003/0063405 A1 | 4/2003 | Jin et al. | |
| 2006/0187800 A1 * | 8/2006 | Ogura ...................... 369/124.04 |

(Continued)

FOREIGN PATENT DOCUMENTS

JP 10-145243 5/1998

(Continued)

OTHER PUBLICATIONS

Kavcic et al., "A Signal-Dependent Autoregressive Channel Model", IEEE Transactions on Magnetics, vol. 35, No. 5, Sep. 1999 pp. 2316-2318.

*Primary Examiner* — Daniell L Negron
*Assistant Examiner* — Regina N Holder
(74) *Attorney, Agent, or Firm* — Hamilton DeSanctis & Cha

(57) ABSTRACT

Various embodiments of the present invention provide systems and methods for data regeneration. For example, a method for data regeneration is disclosed that includes receiving a data input derived from a medium, determining a media defect corresponding to the data input, and determining an attenuation factor associated with the defective medium. Based at least in part on the determination that the medium is defective, amplifying the data input by a derivative of the attenuation factor to regenerate the data.

26 Claims, 9 Drawing Sheets

U.S. PATENT DOCUMENTS

| | | |
|---|---|---|
| 2007/0061687 A1 | 3/2007 | Hwang |
| 2008/0104486 A1* | 5/2008 | Kanaoka .................. 714/780 |
| 2009/0235116 A1 | 9/2009 | Tan et al. |
| 2009/0235146 A1 | 9/2009 | Tan et al. |
| 2009/0268575 A1 | 10/2009 | Tan et al. |
| 2009/0268848 A1 | 10/2009 | Tan et al. |
| 2009/0271670 A1 | 10/2009 | Tan et al. |
| 2010/0042877 A1 | 2/2010 | Tan |

FOREIGN PATENT DOCUMENTS

| | | |
|---|---|---|
| JP | 2007-087529 | 4/2007 |

* cited by examiner

SYSTEMS AND METHODS FOR REDUCING ATTENUATION OF INFORMATION DERIVED FROM A DEFECTIVE MEDIUM

BACKGROUND OF THE INVENTION

The present inventions are related to systems and methods for transferring information, and more particularly to systems and methods for obtaining data from a defective medium associated with a data transfer.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any defects associated with the transfer medium. In some cases, data loss caused by defects in the transfer medium (e.g., a physical defect or noise associated therewith) can make recovery of data from the transfer medium difficult even for data received from non-defective areas or times.

Various approaches have been developed for identifying defects in a transfer medium. In such systems, the identification of a potential defect causes a resulting nullification of any data derived from a given defective area of a medium (i.e., an erasure process). By nullifying the data, errors are not allowed to propagate through later processing steps. Turning to FIG. 1, an example of a system 100 capable of nullifying data is depicted. System 100 includes a digital filter (DFIR) 115 that receives a media data input 105 and provides a filtered version of media input 105 to a detector 120. Detector 120 performs a data detection algorithm and provides an output 170 that includes both a soft output and a hard output. In addition, system 100 includes a defect detector 110 that is operable to identify a period when the medium from which media data input 105 is derived is possibly defective. When a potentially defective region is identified, an output 112 is asserted high causing a multiplexer 125 to select a nullified data set 160 to replace output 170 from detector 120. The output of multiplexer 125 is provided to an interleaver 130 that interleaves the data and provides the interleaved data to a decoder 140. Decoder 140 performs a decoding algorithm on the data and provides a data output 150. In some cases, data output 150 is de-interleaved using a de-interleaver 135 and fed back to detector 120 where it is reprocessed on a subsequent iteration. While system 100 provides for nullifying data derived from a potentially defective region of a medium thereby reducing the possibility of error propagation, it fails to obtain any data from the defective region. In some cases, this is not acceptable as data from the defective region may be highly desirable for one reason or another.

Hence, for at least the aforementioned reasons, there exists a need in the art for advanced systems and methods for obtaining data from potentially defective media.

BRIEF SUMMARY OF THE INVENTION

The present inventions are related to systems and methods for transferring information, and more particularly to systems and methods for obtaining data from a defective medium associated with a data transfer.

Various embodiments of the present invention provide methods for regenerating data derived from a defective medium. Such methods include receiving a data input derived from a medium, determining a media defect corresponding to the data input, and determining an attenuation factor associated with the defective medium. Based at least in part on the determination that the medium is defective, the data input is augmented by a derivative of the attenuation factor to regenerate the data. In some instances of the aforementioned embodiments, the attenuation factor is represented as $\eta$, amplification of the data input is accomplished as part of a detection algorithm, and a branch metric of the detection algorithm is represented as: $\eta^2(f*y/\eta-\text{ideal})^2/N0$, where f is a data dependent noise predictive filter, and ideal is an NPFIR filtered ideal value for a given branch. In particular instances of the aforementioned embodiments, the methods may further include receiving another data input that is also derived from the medium. It is determined that no media defect is evident in relation to the other data input. In such cases, processing the second data input is done using a detector where the branch metric of the detection algorithm is represented as: $(f*y'-\text{ideal})^2/N0'$. As used herein, the term y' designates a scaled version of an input y, and N0' designates a scaled version of a noise factor N0. As one example, y' may be equal to $y/\eta$ and N0' may be equal to $N0/\eta^2$. The detector may utilize a soft output Viterbi algorithm, or a maximum a posteriori algorithm. Based on the disclosure provided herein, one of ordinary skill in the art will recognize other detection algorithms that may be used in relation to various embodiments of the present invention.

In particular instances of the aforementioned embodiments, amplifying the data input by a derivative of the attenuation factor is replaced by nullifying the data input in a first stage processing. In such cases, the first stage generates a soft input that includes the nullified data input. In some cases, the previously described methods further include processing the soft input using a subsequent processing stage. In such cases, the attenuation factor is represented as $\eta$, and processing the soft input using the second stage includes processing the soft input using a data detection algorithm with a branch metric represented as: $(f*y'-\text{ideal})^2/N0'$ plus the soft input.

Other embodiments of the present invention provide systems for regenerating data. Such systems include a media defect detector that is operable to identify a potential media defect associated with a medium from which an input signal is derived, and an attenuation amplitude detector that generates an attenuation factor associated with the input signal. In addition, the systems include a data detector that processes a derivative of the input signal augmented by the attenuation factor when the potential media defect is indicated. The data detector may be, but is not limited to, a soft output Viterbi detector or a maximum a posteriori detector. In some cases, the output of the data detector is provided to a decoder that provides a decoded output reflecting a regenerated value of the input signal. The decoder may be, but is not limited to, a low density parity check decoder.

In one particular instance of the aforementioned embodiments, the attenuation factor is represented as $\eta$, and augmentation of the input signal is accomplished as part of a detection algorithm implemented by the data detector. In such a case, a branch metric of the detection algorithm is represented as: $(f*y'-\text{ideal})^2/N0'$. In some cases, the medium may be, but is not limited to, a magnetic storage medium, a wireless transmission medium, and a wired transmission medium.

Yet other embodiments of the present invention provide systems for regenerating data. Such systems include a media defect detector that is operable to identify a potential media defect associated with a medium from which an input signal is derived, and an attenuation amplitude detector that generates an attenuation factor. Such systems include a first data detector that processes a null data set when the potential media defect is indicated. A decoder is included that receives the output of the first detector and provides a soft input based on the output of the first detector. A second data detector processes a derivative of the input signal augmented by the attenuation factor when the potential media defect is indicated.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for obtaining data from a defective medium associated with a data transfer.

Media defect detection is a key operation in a magnetic recording system. If not appropriately handled, data derived from a defective region of a medium can degrade or even disable such a magnetic recording system. Some embodiments of the present invention provide a mechanism for estimating an attenuation (i.e., generating an attenuation factor) associated with a data signal derived from a defective medium. The attenuation factor is used to augment the data signal derived from the defective medium. This process allows for use of a data signal derived from a defective medium, rather than simply nullifying the input data signal.

Figure 1:
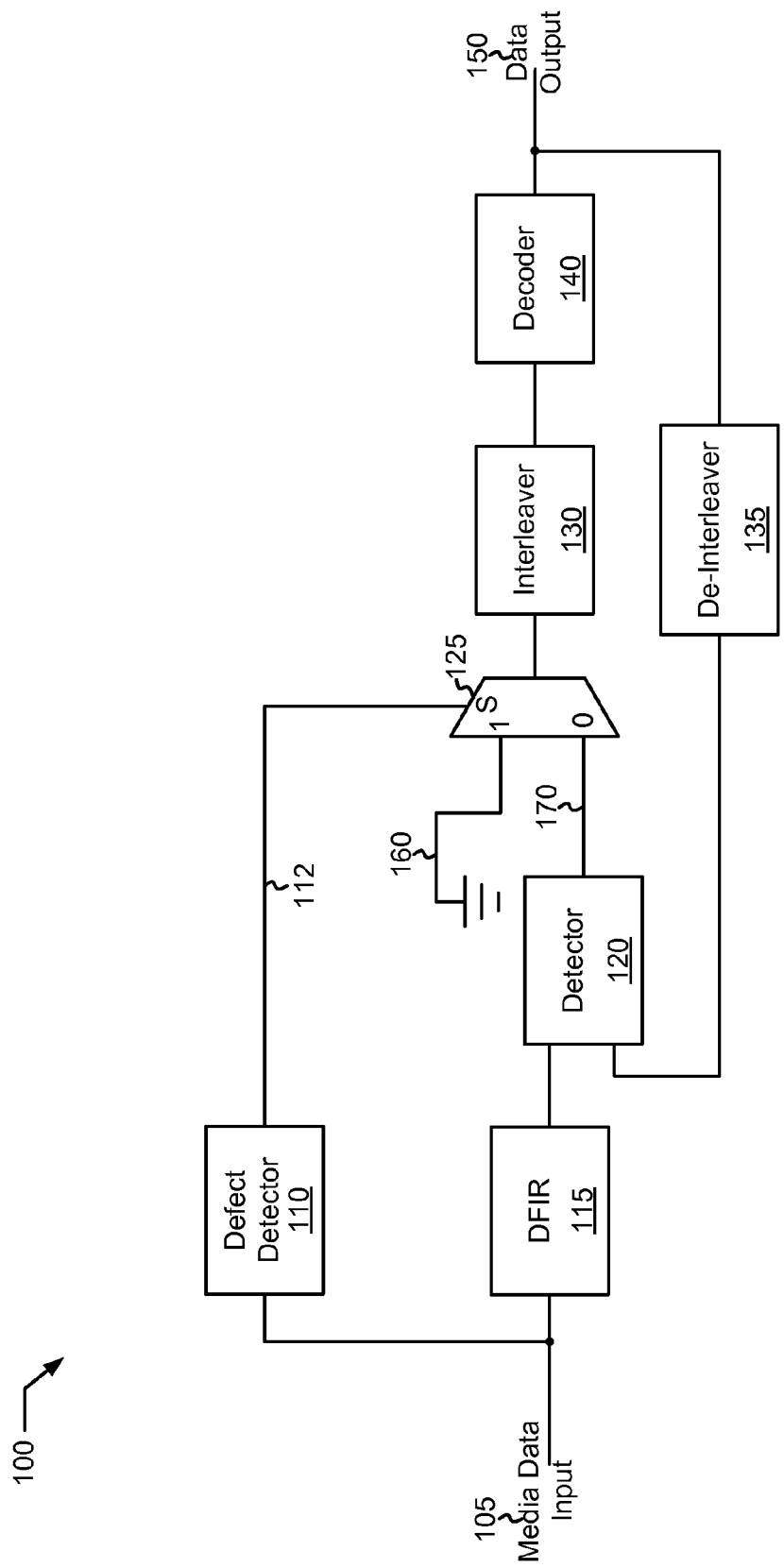
FIG. 1 is a prior art data cancellation system.
Figure 2A:
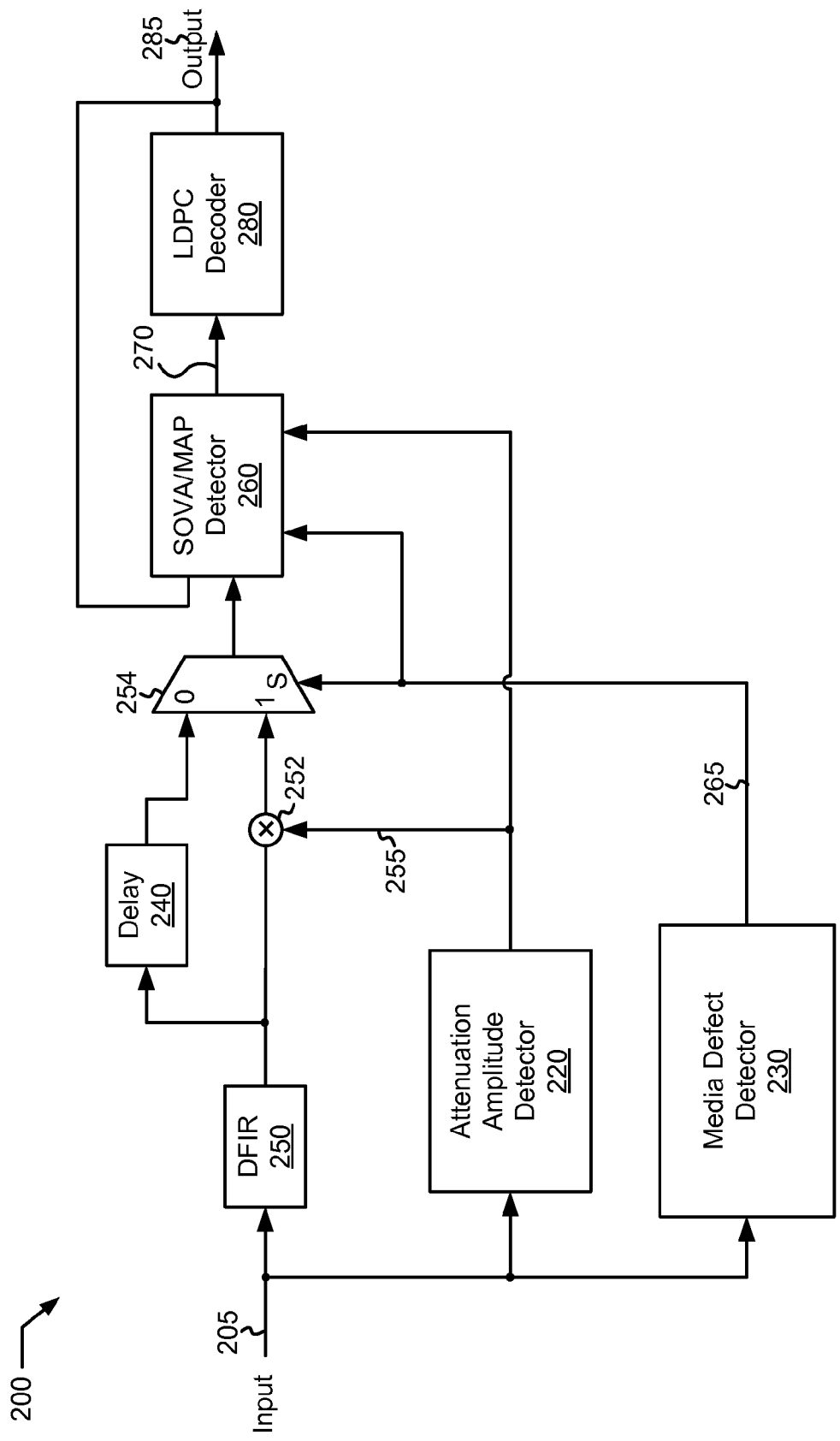
FIG. 2a depicts a data regeneration system in accordance with one or more embodiments of the present invention.

Turning to FIG. 2a, a data regeneration system 200 is depicted in accordance with one or more embodiments of the present invention. Data regeneration system 200 includes an input 205 that may be received via a particular medium (not shown). As an example, input 205 may be derived from a magnetic storage medium, a wireless link, a wired link or the like. Based on the disclosure provided herein one of ordinary skill in the art will recognize a variety of media from which input 205 may be derived. In some cases, input 205 may be amplified and/or converted from one domain to another (e.g., an analog to digital conversion) prior to being received by data regeneration system 200.

Input 205 is provided to a digital FIR filter 250, to an attenuation amplitude detector 220, and a media defect detector 230. Media defect detector 230 may be any circuit or system capable of receiving a data input derived from a medium, and for identifying a possible defect in the medium. Media defect detector 230 provides a media defect flag 265 that is asserted whenever a possible media defect is identified. Exemplary media defect detectors are disclosed in PCT Patent Application No. PCT/US07/80043 entitled "Systems and Methods for Media Defect Detection" and filed on Oct. 1, 2007 by Agere Systems Inc. The entirety of the aforementioned patent application is incorporated herein by reference for all purposes. It should be noted that other types a media defect detection may be used in relation to the various embodiments of the present invention.

Attenuation amplitude detector 220 operates to estimate an attenuation of input 205 caused by a media defect. Attenuation amplitude detector 220 provides a multiplier output 255 that is multiplied by the output of digital filter 250 using a multiplier 252. The product of the multiplication attempts to simulate the filtered data input achievable where no media defect is evident. The output of digital filter 250 is provided to both multiplier 252 and to a delay block 240. The output of delay block 240 and the output of multiplier 252 are both provided to a multiplexer 254. One or the other of the aforementioned outputs is selected based on media defect flag 265. In particular, where media defect flag 265 is asserted indicating a media defect, the output of multiplier 252 is selected. In contrast, where media defect flag 265 is not asserted indicating that no media defect exists, the output of delay block 240 is selected.

The selected output from multiplexer 254 is provided to a detector 260. Detector 260 may be any detector known in the art including, but not limited to, a soft output Viterbi algorithm (SOVA) detector, a maximum a posteriori algorithm (MAP) detector, or another type of detector. Based on the disclosure provided herein, one of ordinary skill in the art will recognize a variety of detectors that may be used in relation to different embodiments of the present invention. The output of detector 260 is provided to a decoder 280 that in some cases may be a low density parity check (LDPC) decoder. The output of decoder 280 is provides as a data output 285 that may also be fed back as an input to detector 260 where iterative processing is desired. In some cases, the branch metric of detector 260 is modified when a media defect is identified. In particular, the branch metric may be modified to divide by $N0/\eta^2$ and when no defect is identified, a division by N0 is indicated.

In operation, the following signal describes the effects of noise and defective media on input signal 205:

$$y = \eta*(\text{input}+\text{jitter}) + \text{electronic noise},$$

where $\eta$ represents the degradation of the signal due to a media defect. Data regeneration system 200 operates to mitigate the attenuation due to a defective medium. To do so, a media defect is first identified using media defect detector 230. At the same time, the degradation in amplitude due to the media defect (i.e., η) is estimated. The samples received during the defective period are recovered by dividing the expected signal by the estimated degradation in amplitude (i.e., η') as set forth in the following equation:

$$y'=y/\eta'=(\text{input}+\text{jitter})\eta/\eta'+(\text{electronic noise})/\eta'.$$

The recovered data is then provided to detector 260 where it is processed as would data that had not been recovered, except that noise variance is amplified in accordance with the following equation:

$$N0'=N0*\beta,$$

where N0 is the power or amplitude of white noise. Thus, when media defect flag 265 is asserted (i.e., a media defect is indicated), the input to detector 260 is:

$$BM=(f*y/\eta'-\text{ideal})^2/N0'.$$

Otherwise, where media defect flag 265 is not asserted (i.e., a media defect is not indicated), the input to detector 260 is:

$$BM=(f*y-\text{ideal})^2/N0.$$

Figure 2B:
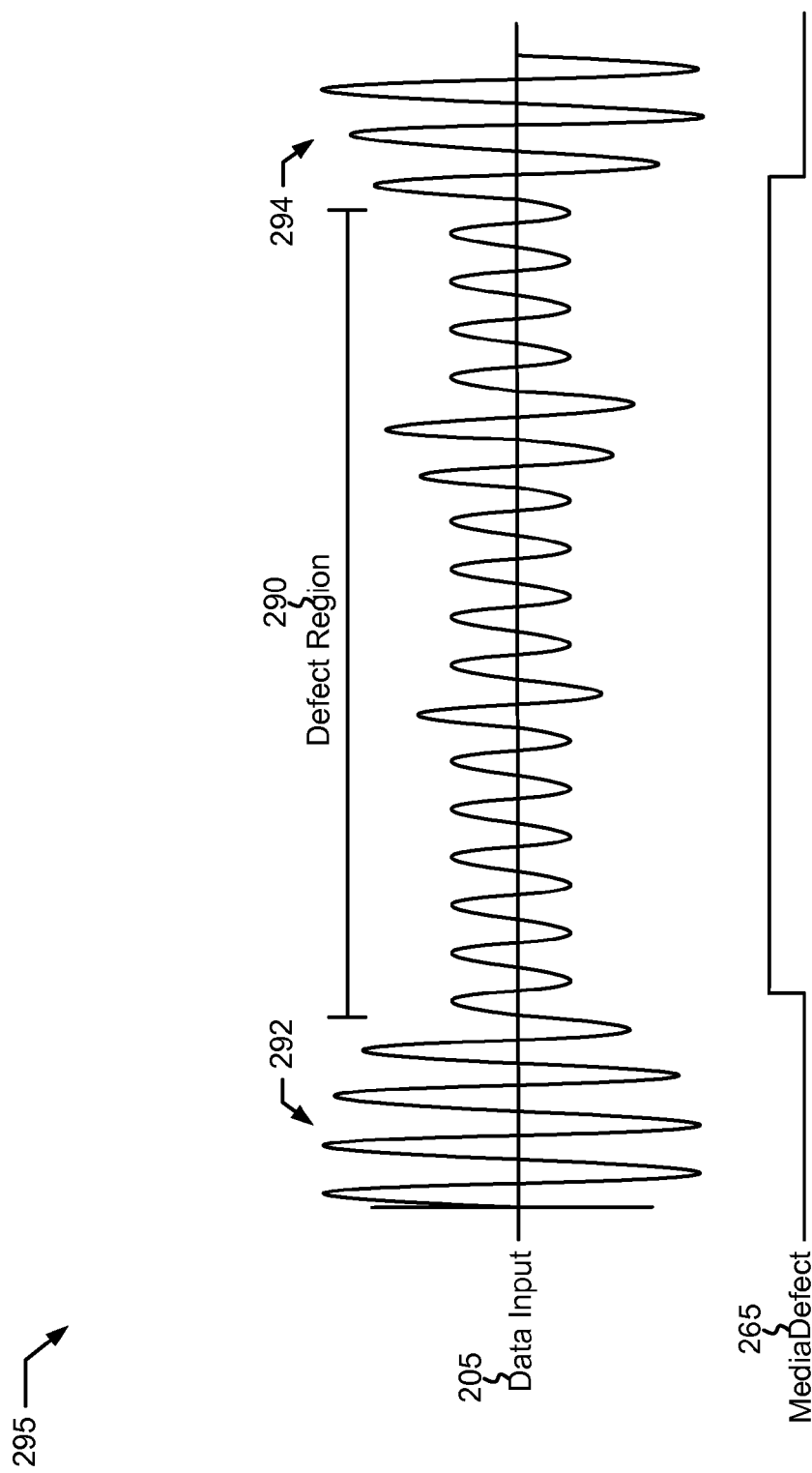
FIG. 2b is a timing diagram depicting an exemplary operation of the data regeneration system in accordance with some embodiments of the present invention.

Thus, referring to FIG. 2b, a timing diagram shows an exemplary data input signal 205 is shown that includes both non-defective regions 292, 294 and an intervening defective region 290. When media defect flag 265 is asserted high indicating defect region 290, data input 205 is multiplied by the inverse of the estimated attenuation factor (η') such that the amplitude of data input signal 205 during the defect region is recovered. In contrast, data input signal 205 is left unchanged during non-defective regions 292, 294. From a signal to noise analysis of the signal and noise after the NPFIR, the signal to noise ratio (SNR) scale due to media defect amplitude dropout η is represented by the following equation:

$$\frac{1}{1+\left(\frac{1}{\eta^2}-1\right)f_E},$$

where $f_E$ is the percentage of electronic noise. Therefore, the scalars to achieve the best signal to noise ratio after scaling are:

$$\eta' = \eta, \text{ and } \beta = 1\left(\frac{1}{\eta^2}-1\right)f_E.$$

However, since it is hard to estimate $f_E$ and it is often beneficial to scale down unreliable LLR outputs (i.e., LLR outputs from a defective region), $f_E$ may be set equal to unity. As a result, $$\eta' = \eta, \text{ and } \beta = \frac{1}{\eta^2}.$$

In hardware, η' is estimated and is generally something other than $$\eta' = \eta, \text{ and } \beta = \frac{1}{\eta'^2}$$

is used. Hereafter for purposes of this application, when the symbol η is used it indicates an estimate thereof made by an attenuation amplitude determination circuit.

Figure 2C:
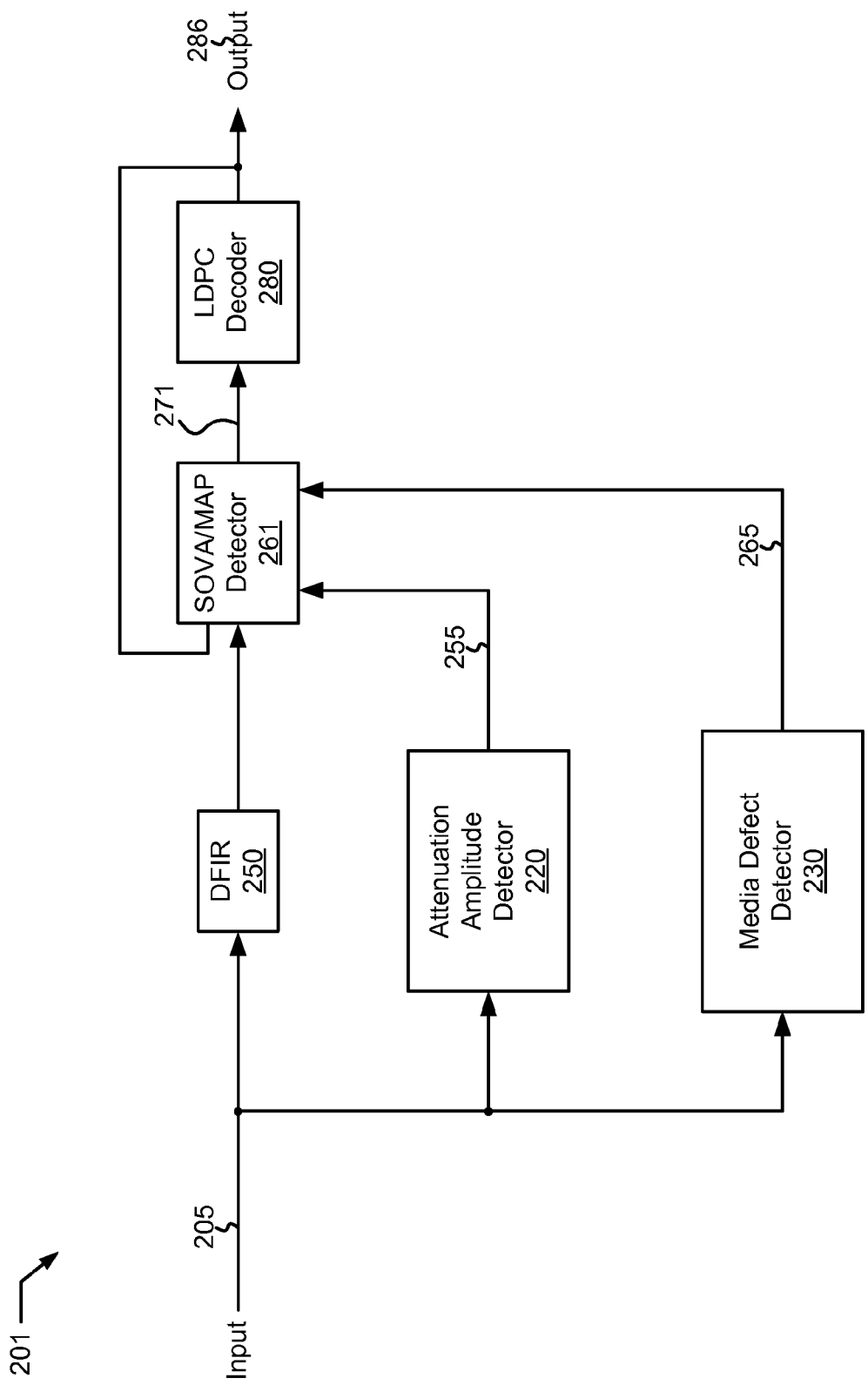
FIG. 2c depicts an alternative to FIG. 2a where the signal modification is effected through a modified branch metric in a later detector in accordance with one or more embodiments of the present invention.

FIG. 2c depicts an alternative data regeneration system 201 where the signal modification is effected entirely through a modified branch metric in a SOVA/MAP detector 261 in accordance with one or more embodiments of the present invention. In particular, SOVA/MAP detector 261 receives the output from digital filter 250, as well as multiplier output 255 and media defect flag 265. In such a system, the branch metric of SOVA/MAP detector 261 is modified in accordance with the following pseudo-code:

```
IF (Media Defect Flag 265 Indicates no Defect)
{
    Output = (f*y-ideal)²/N0
}
ELSE IF (Media Defect Flag 265 Indicates a Defect)
{
    Output = (f*y - η*ideal)²/N0
}
```

Detector 265 provides a soft output 271 to LDPC decoder 280 that provides an output 286. In some cases, output 286 is fed back to SOVA/MAP detector 261 for an additional iteration(s).

Figure 3:
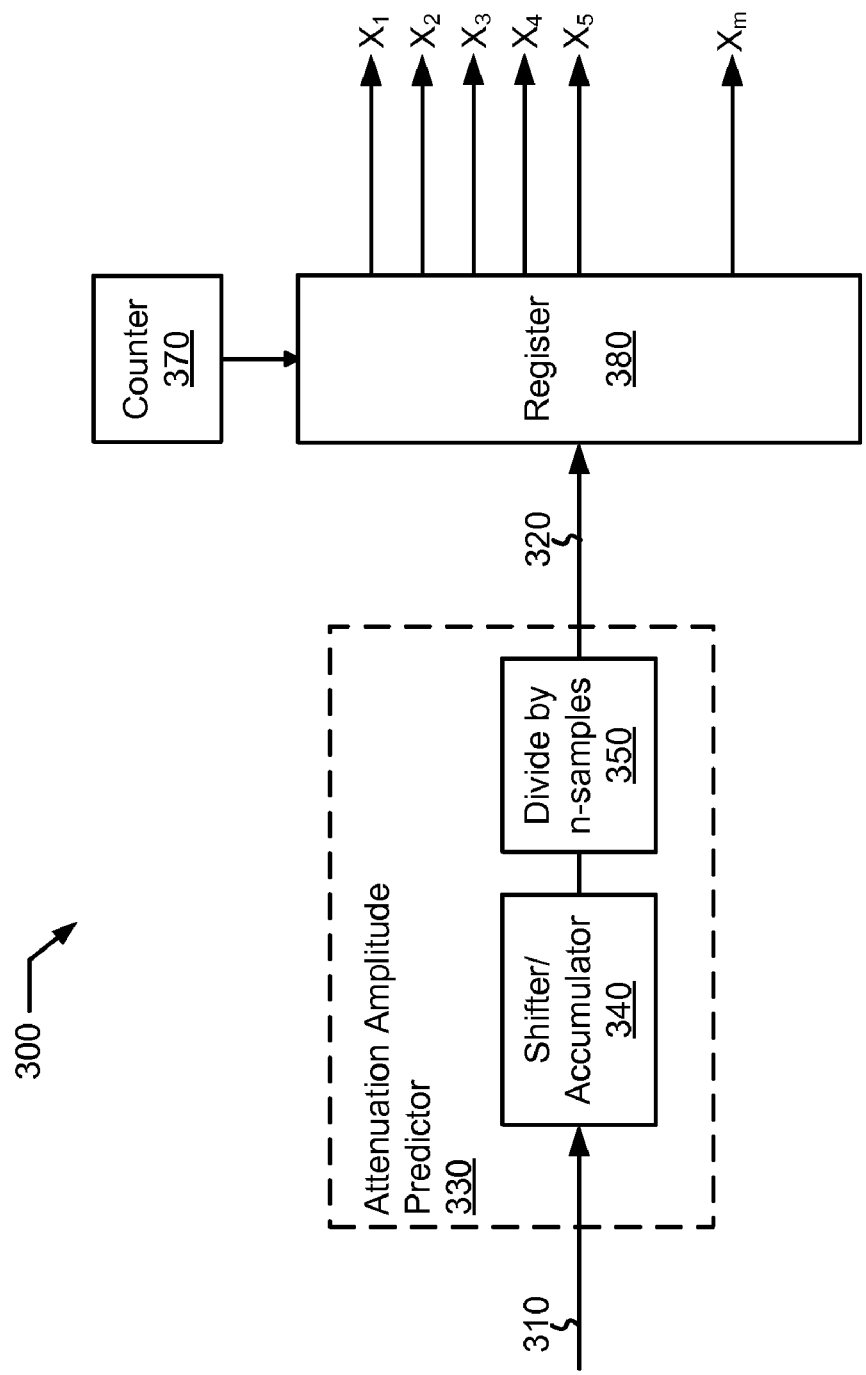
FIG. 3 depicts an attenuation amplitude determination circuit in accordance with various embodiments of the present invention.

Turning to FIG. 3, an attenuation amplitude determination circuit 300 is shown in accordance with various embodiments of the present invention. Attenuation amplitude determination circuit 300 includes an attenuation amplitude predictor circuit 330, a register 380 and a counter 370. In operation, attenuation amplitude predictor circuit 330 provides a number (m) of magnitude outputs (X) that are registered over a period as controlled by a counter 370. Attenuation amplitude predictor 330 includes a shifter/accumulator 340 stores a number of samples (n) of an input 310 which are then summed. A divider circuit 350 receives the sum of n-samples and divides the sum by n to yield the average value 320 of the samples. Average value 320 is then stored to a location in register 380 under the direction of counter 370. A subsequent n-samples of input 310 are processed and stored to another location in register 380 under the direction of counter 370. This process is repeated until a number of magnitude outputs (X) are generated covering different sample portions of input 310. In some cases, the samples used to generate one magnitude output ($X_i$) overlap to some degree with the samples used to generate a subsequent magnitude output ($X_{i+1}$). These magnitude outputs are compared with corresponding maximum magnitude outputs (or outputs from known non-defective regions) from other regions of the medium to determine respective corresponding attenuation factors (η). As discussed above in relation to FIG. 2, one or more of the determined attenuation factors is applied to the input signal whenever a media defect is indicated to simulate the amplitude of the input were the media defect not at issue. It should be noted that the figures provide only an example of amplitude detection. Based on the disclosure provided herein, one of ordinary skill in the art will recognize other approaches for amplitude detection that may be used in relation to different embodiments of the present invention.

Figure 4:
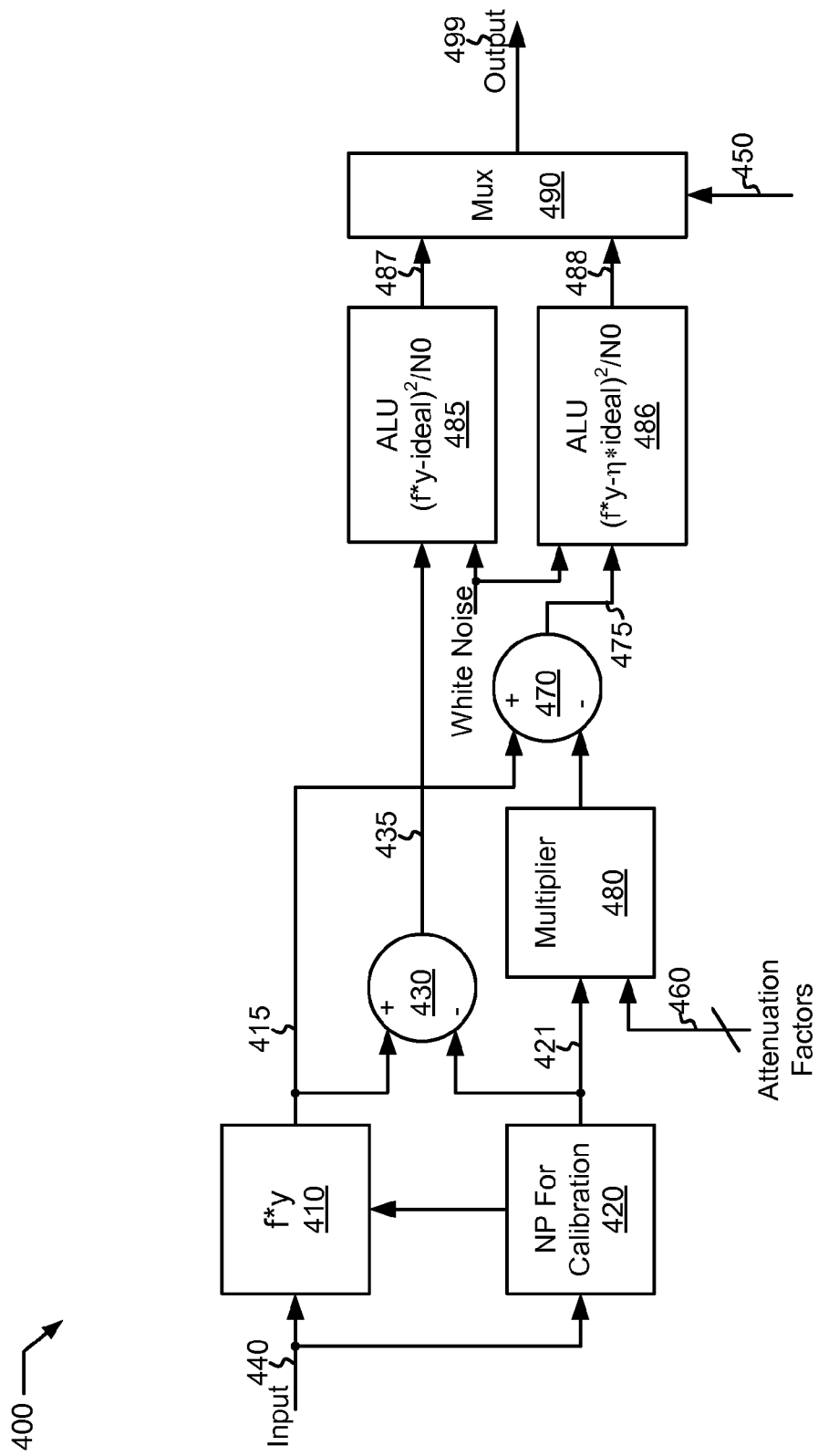
FIG. 4 depicts an attenuation correction circuit in accordance with one or more embodiments of the present invention.

Turning to FIG. 4, an attenuation correction circuit 400 that may be used in accordance with different embodiments of the present invention is disclosed. Attenuation correction circuit 400 allows for selection of a non-adjusted signal when a media defect flag 450 does not indicate a defect, and provides an adjusted signal when media defect flag 450 indicates a media defect. Attenuation correction circuit 400 receives an input 440 (i.e., y) that is applied to a functional circuit 410 performing an noise predictive FIR (NPFIR) filter function f*y as is known in the art. An output 415 of functional circuit 410 is f*y. In addition, input 440 is provided to a noise predictive FIR calibration circuit 420 that generates a branch ideal signal 421 as is known in the art. Branch ideal signal 421 corresponds to the error free data dependent branch, ideal. A summation circuit 430 subtracts ideal from f*y to yield an output 435 corresponding to f*y−ideal. Output 435 is provided to an ALU 485 that squares the received output and divides it by the white noise factor N0, and provides an output 487 corresponding to (f*y−ideal)$^2$/N0. Output 487 is selected by multiplexer 490 whenever media defect flag 450 indicates that there is not a media defect.

In addition, branch ideal signal 421 is provided to a multiplier 480 that multiplies ideal by a selected one of the attenuation factors ($\eta$) 460 to yield an output 481 corresponding to ideal*$\eta$. Output 481 is subtracted from output 415 using a summation circuit 430 to yield an output 475 corresponding to (f*y−ideal*$\eta$)$^2$. Output 475 is provided to an ALU 486 that squares the received output, and divides the squared result by the white noise factor (N0) divided by the selected attenuation factor squared to yield an output 488 corresponding to (f*y−$\eta$*ideal)$^2$/N0. f*y/$\eta$ corresponds to the value of the filtered input attenuated due to a media defect. Output 488 is selected by multiplexer 490 whenever media defect flag 450 indicates that there is a media defect resulting in an attenuation (i.e., f*y/$\eta$). In sum, the following pseudo-code represents an output 499 of attenuation correction circuit 400 based on media defect flag 450:

```
IF (Media Defect Flag 450 Indicates no Defect)
{
    Output = (f*y−ideal)²/N0
}
ELSE IF (Media Defect Flag 450 Indicates a Defect)
{
    Output = (f*y−η*ideal)²/N0
}
```

Referring to FIG. 2a, it should be noted that the aforementioned sample recovery may be done before the samples are fed into SOVA/MAP detector 260 using a circuit similar to attenuation correction circuit 400. Alternatively, the aforementioned sample recovery may be accomplished by modifying the branch metric of SOVA/MAP detector 260 where attenuation factors and a media defect flag is made available to SOVA/MAP detector 260 in accordance with the following pseudo-code:

```
IF (Media Defect Flag Indicates no Defect)
{
        Branch Metric = (f*y − ideal)²/N0
}
ELSE IF (Media Defect Flag Indicates a Defect)
{
        Branch Metric = ((f*y/η) − ideal)² / (N0/η²)
}
```

In such a hardware implementations, the division of the output by N0 or N0/$\eta^2$ may be realized by two scaling factors in front of SOVA/MAP detector 260 or by modifying the branch metric o SOVA/MAP detector 260 to divide by N0/$\eta^2$ whenever the branch metric would normally have been divided by N0.

Figure 5:
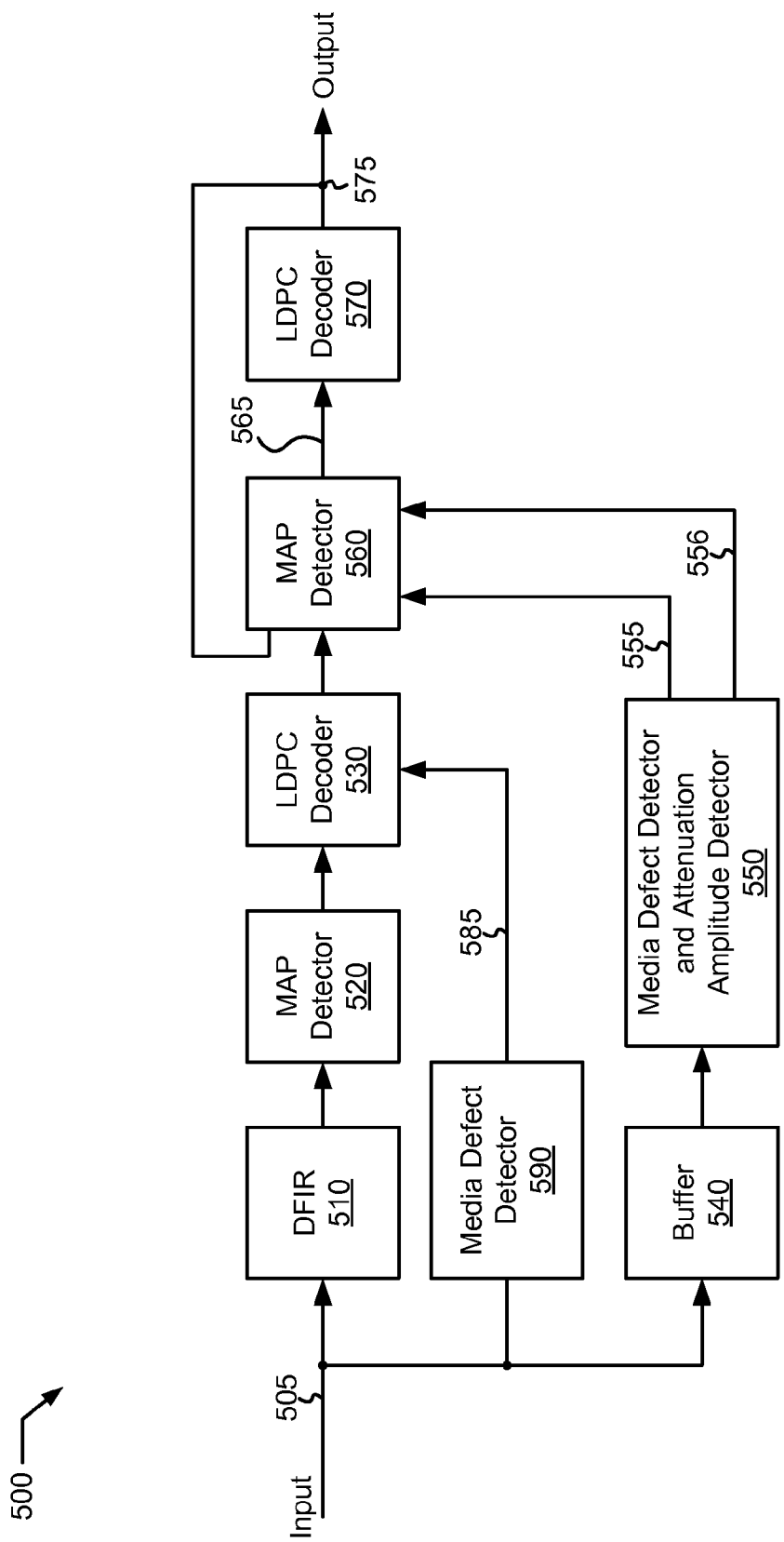
FIG. 5 depicts a data regeneration system in accordance with some embodiments of the present invention.

In some cases, the delay on DFIR samples and/or on media defect detector 230 may not be acceptable when the decision of SOVA/MAP detector 260 is used to drive analog/digital loops in a magnetic read channel. In such cases, no change may be made to an initial SOVA/MAP detector and it may be possible to buffer estimated attenuation factors that are used in a later SOVA/MAP detector similar to that discussed below in relation to FIG. 5. In such cases, a simple erasure decoding may be used during the first iteration. Further, it may be possible to not perform a DFIR process on the first iteration. Turning to FIG. 5, a data regeneration system 500 is depicted in accordance with one or more embodiments of the present invention. Data regeneration system 500 receives an input 505 that is provided to a digital FIR filter 510, media defect detector 590 and a buffer 540. Input 505 may be received via a particular medium (not shown). As an example, input 505 may be derived from a magnetic storage medium, a wireless link, a wired link or the like. Based on the disclosure provided herein one of ordinary skill in the art will recognize a variety of media from which input 505 may be derived. In some cases, input 505 may be amplified and/or converted from one domain to another (e.g., an analog to digital conversion) prior to being received by data regeneration system 500.

Media defect detector 590 provides a media defect output 595 indicating the presence or absence of a potential media defect to an LDPC decoder 530. Media defect output 595 is asserted whenever a possible media defect is identified. Media defect detector 590 may be any media defect detector known in the art that is capable of determining the possibility of a media defect. Exemplary media defect detectors are disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention.

A media defect output 555 provided by a combination media defect detector and attenuation amplitude detector 550 is asserted whenever a possible media defect is identified. Combination media defect detector and attenuation amplitude detector 550 may include any media defect detector known in the art that is capable of determining the possibility of a media defect. Exemplary media defect detectors are disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention. In addition, combination media defect detector and attenuation amplitude detector 550 also includes an attenuation factor determination circuit. Such a circuit may be similar to that described in relation to FIG. 3 above.

The output of digital FIR filter 510 is provided to a MAP detector 520 that operates consistent with MAP detectors as are known in the art. A soft output from MAP detector 520 is provided to an LDPC decoder 530 as are known in the art, except that the soft input from MAP detector 520 provided as an input to LDPC decoder 530 is nullified whenever media defect detector 595 is asserted indicating that a media defect exists.

The output of LDPC decoder 530 is provided to a subsequent MAP detector 560 that operates consistent with MAP detectors as are known in the art, except that the branch metric of MAP detector 560 is modified through a data regeneration process whenever media defect detector 555 is asserted indicating that a media defect exists. The following pseudo-code represents the branch metric of MAP detector 560 where the value of η is a selected attenuation factor 556 designed to regenerate data derived from a defective media:

```
IF (Media Defect Flag 595 Indicates no Defect)
{
    Branch Metric = (f*y–ideal)²/N0 + Soft Input
}
ELSE IF (Media Defect Flag 595 Indicates a Defect)
{
    Branch Metric = (f*y/–η*ideal)²/N0 + Soft Input
}
```

An output 575 of MAP detector 560 is provided to an LDPC decoder 570 that provides a decoded output 575. LDPC decoder 570 provides LDPC decoding as is known in the art. Decoded output 575 may be iteratively processed by being fed back to MAP detector 560 until convergence is accomplished.

Figure 6:
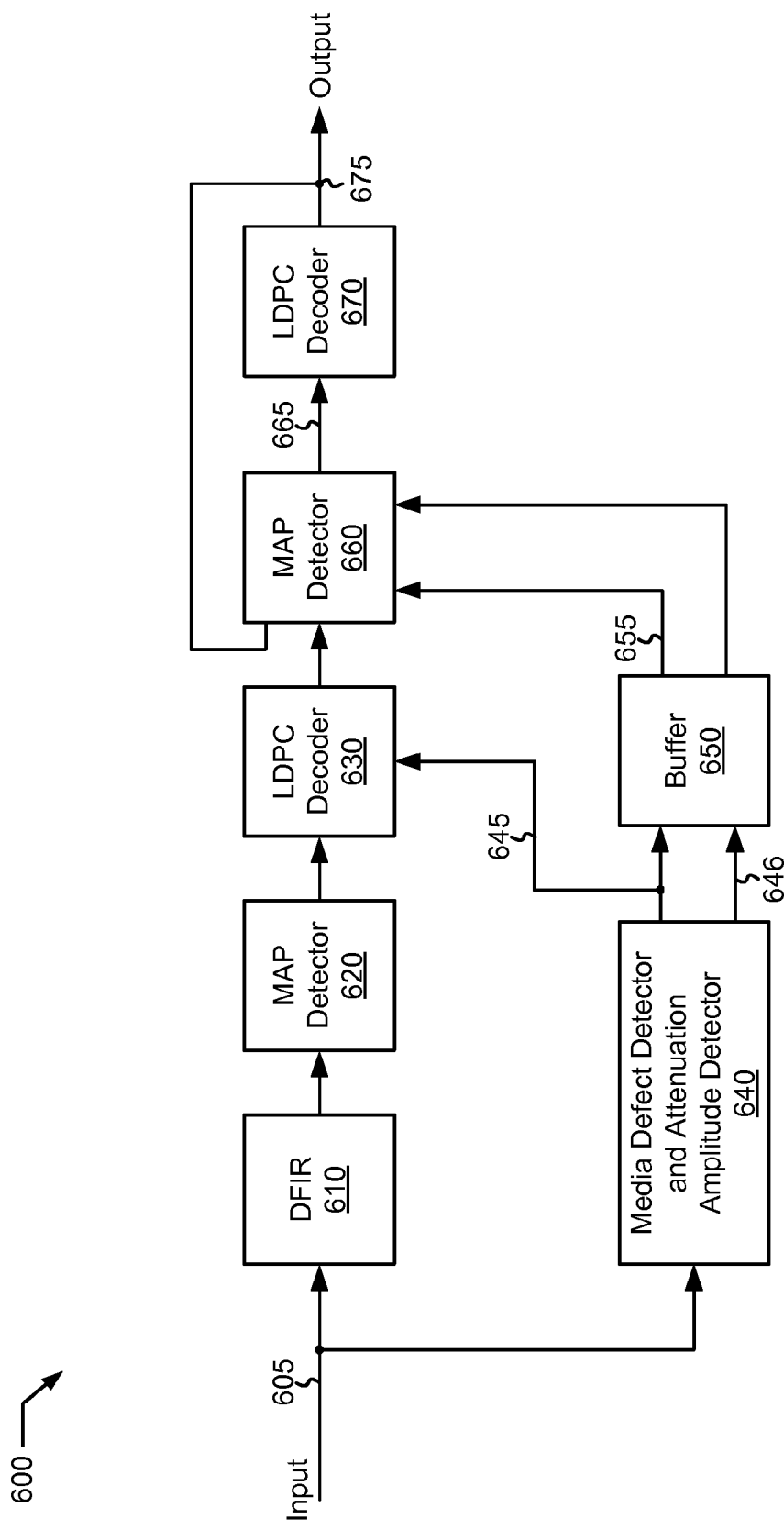
FIG. 6 shows another data regeneration system in accordance with one or more embodiments of the present invention.

Turning to FIG. 6, a data regeneration system 600 is depicted in accordance with various embodiments of the present invention. Data regeneration system 600 receives an input 605 that is provided to both a digital FIR filter 610 and a combination media defect detector and attenuation amplitude detector 640. Input 605 may be received via a particular medium (not shown). As an example, input 605 may be derived from a magnetic storage medium, a wireless link, a wired link or the like. Based on the disclosure provided herein one of ordinary skill in the art will recognize a variety of media from which input 605 may be derived. In some cases, input 605 may be amplified and/or converted from one domain to another (e.g., an analog to digital conversion) prior to being received by data regeneration system 600.

Combination media defect detector and attenuation amplitude detector 640 provides both a media defect output 645 and attenuation factors 646. Media defect output 645 is asserted whenever a possible media defect is identified. Combination media defect detector and attenuation amplitude detector 640 may include any media defect detector known in the art that is capable of determining the possibility of a media defect. Exemplary media defect detectors are disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention. In addition, media defect detector and attenuation amplitude detector 640 also includes an attenuation factor determination circuit. Such a circuit may be similar to that described in relation to FIG. 3 above.

The output of digital FIR filter 610 is provided to a MAP detector 620 that operates consistent with MAP detectors as are known in the art. A soft output from MAP detector 620 is provided to an LDPC decoder 630 as are known in the art, except that the soft input from MAP detector 620 provided as an input to LDPC decoder 630 is nullified whenever media defect detector 645 is asserted indicating that a media defect exists.

The output of LDPC decoder 630 is provided to a subsequent MAP detector 660 that operates consistent with MAP detectors as are known in the art, except that the branch metric of MAP detector 660 is modified through a data regeneration process whenever media defect detector 655 is asserted indicating that a media defect exists. In some cases, MAP detector 660 is a MAP4 detector as is known in the art. The following pseudo-code represents the branch metric of MAP detector 660 where the value of η is a selected attenuation factor 656 designed to regenerate data derived from a defective media:

```
IF (Media Defect Flag 655 Indicates no Defect)
{
    Branch Metric = (f*y–ideal)²/N0 + Soft Input
}
ELSE IF (Media Defect Flag 655 Indicates a Defect)
{
    Branch Metric = (f*y–η*ideal)²/N0 + Soft Input
}
```

An output 675 of MAP detector 660 is provided to an LDPC decoder 670 that provides decoded output 675. LDPC decoder 670 provides LDPC decoding as is known in the art. Decoded output 675 may be iteratively processed by being fed back to MAP detector 660 until convergence is accomplished.

Figure 7:
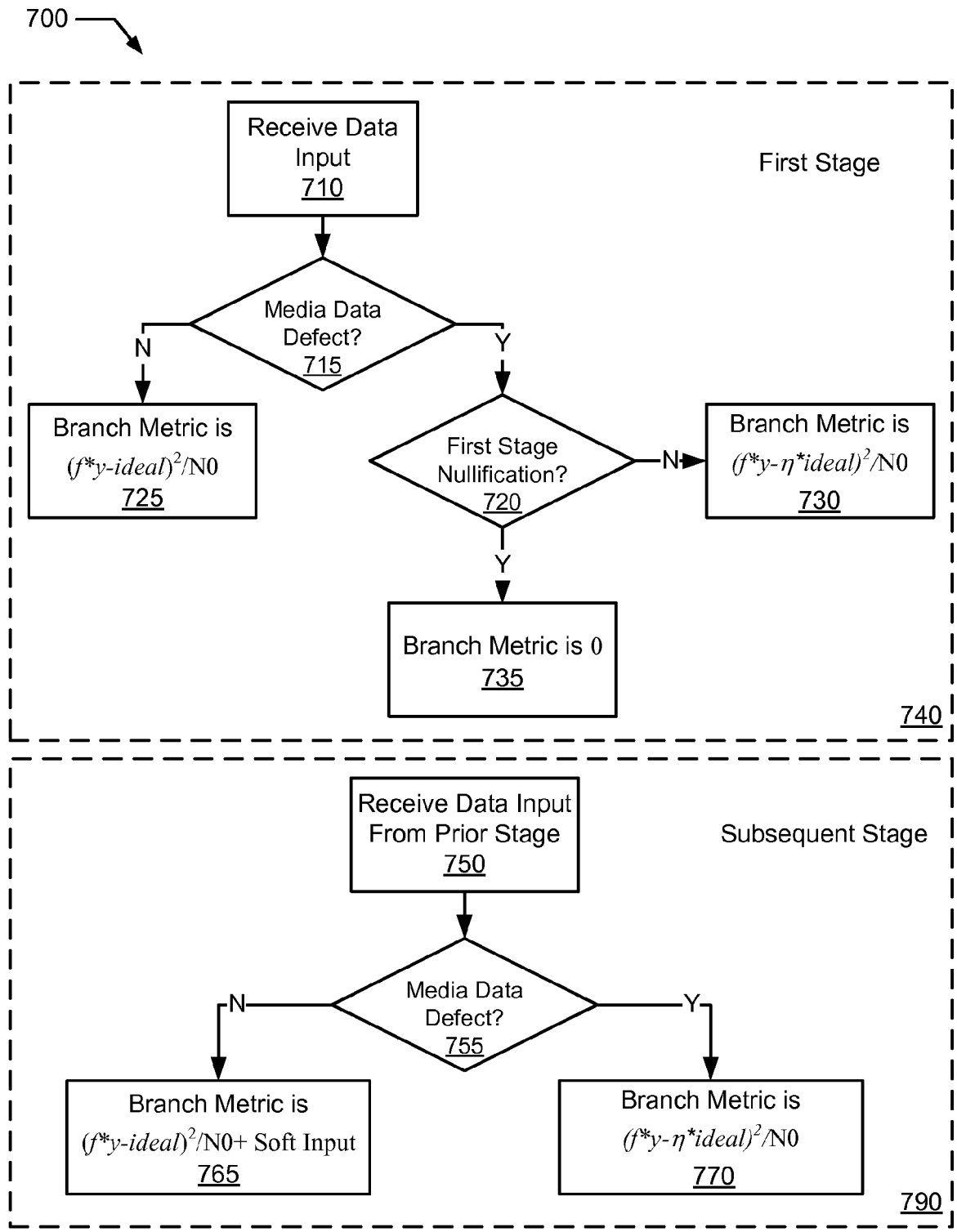
FIG. 7 is a flow diagram depicting a method for data regeneration in accordance with various embodiments of the present invention.

Turning to FIG. 7, a flow diagram 700 depicts a method in accordance with various embodiments of the present invention for data regeneration. Flow diagram 700 is described in relation to a first stage 740 and a second stage 790. In first stage 740, a data input is received (block 710). This data input may be received, for example, from a magnetic storage medium. Based on the disclosure provided herein, one of ordinary skill in the art will recognize a variety of media from which the data input may be received. It is determined whether a media defect has been detected in relation to the particular data input (block 715). Where a media defect is not indicated (block 715), a branch metric related to processing the data input is selected to be $(f*y-ideal)^2/N0$ (block 725). Alternatively, where it is determined that a media defect is indicated (block 715), it is determined whether first stage nullification is desired (block 720). Where first stage nullification is desired (block 720), the branch metric is set equal to zero (block 735). In contrast, where it is determined that first stage nullification is not desired (block 720), the branch metric is selected to be $(f*y-\eta*ideal)^2/N0$ (block 730).

In subsequent stage 790, soft data from a prior stage is received after processing through a decoder (block 750). It is determined if the data was associated with a media defect (block 755). Where it was associated with a media defect (block 755), the branch metric is selected to be $(f*y-\eta*ideal)^2/N0$+Soft Input (block 770). In contrast, when a media defect is not indicated (block 755), the branch metric is selected to be $(f*y-ideal)^2/N0$+Soft Input (block 765).

It should be noted that various modifications to the specific embodiments of the present invention discussed herein may be done in accordance with the breadth of the inventions disclosed herein. For example, it may be that the transitional period between a defective and non-defective region may be considered to volatile to use for regenerating a data signal in accordance with the approaches discussed herein. In such cases, it may be that data regeneration is only performed in the middle of the window during which a media defect flag is asserted. This would avoid data regeneration during the transition from a non-defective region to a defective region, and from a defective region to a non-defective region. In such a case, a simple erasure process (i.e., setting the data equal to a known value such as zero) may be applied once a media defect is identified and for a period after the media defect is identified. Once the period has passed, the process may convert to utilizing regenerated data. This process of using regenerated data could then be replaced by another period of the simple erasure process when the end of the defect period is predicted. Once the media defect has passed, the process could return to using the standard data input for processing. Based on the disclosure provided herein, one of ordinary skill in the art will recognize a variety of other modifications that may be implemented in accordance with yet other embodiments of the present invention.

In conclusion, the invention provides novel systems, devices, methods and arrangements for regenerating data derived from a defective medium. While detailed descriptions of one or more embodiments of the invention have been given above, various alternatives, modifications, and equivalents will be apparent to those skilled in the art without varying from the spirit of the invention. For example, one or more embodiments of the present invention may be applied to iterative decoding channels that either include or do not include a LDPC coded channel. Alternatively, the techniques discussed herein may be applied to either a non-precoded channel or to a precoded channel. Further, techniques discussed herein may be applied to analog to digital converters as well. Therefore, the above description should not be taken as limiting the scope of the invention, which is defined by the appended claims.

What is claimed is:

1. A system for regenerating data, the system comprising:
   a media defect detector, wherein the media defect detector is operable to identify a potential media defect associated with a medium from which an input signal is derived;
   an attenuation amplitude detector, wherein the attenuation amplitude detector generates an attenuation factor; and
   a data detector, wherein the data detector processes a derivative of the input signal, wherein an amplitude of the derivative of the input signal is augmented by the attenuation factor when the potential media defect is indicated.

2. The system of claim 1, wherein the data detector is selected from a group consisting of: a soft output Viterbi detector, and a maximum a posteriori detector.

3. The system of claim 1, wherein an output of the data detector is provided to a decoder, and wherein the decoder provides a decoded output reflecting a regenerated value of the input signal.

4. The system of claim 3, wherein the decoder is a low density parity check decoder.

5. The system of claim 1, wherein the attenuation factor is represented as $\eta$, wherein augmentation of the derivative of the input signal is accomplished as part of a detection algorithm implemented by the data detector, wherein the derivative of the input signal is represented by ideal, and wherein a branch metric of the detection algorithm is represented as:

$$(f*y-\eta(ideal))^2/N0,$$

wherein f*y is a filtered version of the data input, and wherein N0 represents white noise.

6. The system of claim 1, wherein the data detector processes the input signal without augmentation by the attenuation factor when the potential media defect is not indicated.

7. The system of claim 1, wherein the data detector is a first data detector, and wherein the system further comprises:
   a second data detector, wherein the second data detector processes a null data set when the potential media defect is indicated.

8. The system of claim 7, wherein the second data detector provides a soft input, wherein the attenuation factor is represented as $\eta$, wherein augmentation of the input signal is accomplished as part of a detection algorithm implemented by the first data detector, and wherein a branch metric of the detection algorithm is represented as: $(f*y-\eta(ideal))^2/N0$ plus the soft input.

9. The system of claim 7, wherein an output of the second data detector is provided to a decoder, and wherein an output of the decoder is provided to the first data detector.

10. The system of claim 9, wherein the decoder is a low density parity check decoder.

11. The system of claim 1, wherein the medium is selected from a group consisting of: a magnetic storage medium, a wireless transmission medium, and a wired transmission medium.

12. A system for regenerating data, the system comprising:
   a media defect detector, wherein the media defect detector is operable to identify a potential media defect associated with a medium from which an input signal is derived;
   an attenuation amplitude detector, wherein the attenuation amplitude detector generates an attenuation factor;
   a first data detector, wherein the first data detector processes a null data set when the potential media defect is indicated;
   a decoder, wherein the decoder receives the output of the first detector and provides a soft input based on the output of the first detector; and
   a second data detector, wherein the second data detector processes a derivative of the input signal augmented by the attenuation factor when the potential media defect is indicated.

13. The system of claim 12, wherein the first data detector and the second data detector are selected from a group consisting of: a soft output Viterbi detector, and a maximum a posteriori detector.

14. The system of claim 12, wherein the decoder is a low density parity check decoder.

15. The system of claim 12, wherein the decoder is a first decoder, and wherein the system further comprises:
   a second decoder operable to provide a decoded output reflecting a regenerated value of the input signal.

16. The system of claim 12, wherein the attenuation factor is represented as $\eta$, wherein augmentation of the derivative of the input signal is accomplished as part of a detection algorithm implemented by the data detector, wherein the derivative of the input signal is represented by ideal, and wherein a branch metric of the detection algorithm is represented as:

$$(f*y-\eta(ideal))^2/N0+\text{the soft input},$$

wherein f*y is a filtered version of the data input, and wherein N0 represents white noise.

17. The system of claim 12, wherein the second data detector is operable to process the input signal without augmentation by the attenuation factor when the potential media defect is not indicated.

18. The system of claim 12, wherein the medium is selected from a group consisting of: a magnetic storage medium, a wireless transmission medium, and a wired transmission medium.

19. A method for regenerating data derived from a defective medium, the method comprising:
   receiving a data input derived from a medium;
   determining a media defect corresponding to the data input;
   determining an attenuation factor associated with the media defect; and based at least in part on the determination of the media defect, augmenting an amplitude of a signal derived from the data input by an amount corresponding to the attenuation factor to regenerate a data set from the storage medium.

20. The method of claim 19, wherein the attenuation factor is represented as $\eta$, wherein the signal derived from the data input is represented by ideal, and wherein augmenting the amplitude of the signal derived from the data input is accomplished as part of a data detection algorithm done in accordance with the following equation:

$$(f*y - \eta(ideal))^2,$$

wherein f*y is a filtered version of the data input.

21. The method of claim 20, wherein augmenting the amplitude of the signal derived from the data input is done as part of calculating a branch metric used in relation to the data detection algorithm in accordance with the following equation:

$$(f*y - \eta(ideal))^2/N0,$$

wherein N0 represents white noise.

22. The method of claim 21, wherein the data input is a first data input, wherein the method further comprises:
  receiving a second data input, wherein the second data input is derived from the medium;
  determining that the medium is non-defective at the location corresponding to the second data input;
  processing the second data input using a detector, wherein the branch metric of the detection algorithm is represented as: $(f*y - ideal)^2/N0$.

23. The method of claim 20, wherein the data detection algorithm is selected from a group consisting of: a soft output Viterbi algorithm, and a maximum a posteriori algorithm.

24. The method of claim 19, wherein augmenting the amplitude of the signal derived from the data input is done by multiplying the signal derived from the data input by an amount corresponding to the attenuation factor.

25. The method of claim 24, wherein amplifying the data input by a derivative of the attenuation factor is replaced by nullifying the data input in a first stage processing, wherein a soft input is generated that includes the nullified data input.

26. The method of claim 25, wherein the method further comprises:
  processing the soft input using a subsequent processing stage, wherein the attenuation factor is represented as $\eta$, wherein processing the soft input using the second stage includes processing the soft input using a data detection algorithm, and wherein the a branch metric of the detection algorithm is represented as: $\eta^2(f*y/\eta - ideal)^2/N0$ plus the soft input, wherein the attenuation factor is represented as $\eta$, wherein the signal derived from the data input is represented by ideal, wherein f*y is a filtered version of the data input, and wherein N0 represents white noise.

* * * * *